(12) United States Patent
Ohsawa

(10) Patent No.: US 7,145,811 B2
(45) Date of Patent: Dec. 5, 2006

(54) SEMICONDUCTOR STORAGE DEVICE

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/891,000

(22) Filed: Jul. 15, 2004

(65) Prior Publication Data

US 2005/0232043 A1     Oct. 20, 2005

(30) Foreign Application Priority Data

Apr. 15, 2004   (JP)  ............................. 2004-120628

(51) Int. Cl.
*G11C 7/10*    (2006.01)

(52) U.S. Cl. ................. 365/189.05; 365/222; 365/196; 365/205; 365/174; 365/185.05; 365/190

(58) Field of Classification Search ........... 365/189.05, 365/185.05, 222, 205, 174, 190, 196
See application file for complete search history.

(56) References Cited

U.S. PATENT DOCUMENTS

| | | | |
|---|---|---|---|
| 5,384,742 A * | 1/1995 | Miyakawa et al. | 365/185.13 |
| 5,822,264 A * | 10/1998 | Tomishima et al. | 365/222 |
| 6,436,744 B1 * | 8/2002 | Bryant et al. | 438/151 |
| 6,538,916 B1 | 3/2003 | Ohsawa | |
| 6,617,651 B1 | 9/2003 | Ohsawa | |
| 6,621,725 B1 | 9/2003 | Ohsawa | |
| 6,650,565 B1 * | 11/2003 | Ohsawa | 365/185.05 |
| 6,768,662 B1 * | 7/2004 | Hidaka et al. | 365/51 |
| 6,781,875 B1 * | 8/2004 | Ohsawa | 365/174 |
| 6,868,000 B1 * | 3/2005 | Chan et al. | 365/154 |
| 6,882,008 B1 * | 4/2005 | Ohsawa | 257/347 |
| 6,888,770 B1 * | 5/2005 | Ikehashi | 365/205 |
| 6,912,150 B1 * | 6/2005 | Portman et al. | 365/149 |
| 6,934,212 B1 * | 8/2005 | Ito | 365/222 |
| 2005/0047240 A1 * | 3/2005 | Ikehashi et al. | 365/222 |

\* cited by examiner

*Primary Examiner*—Viet Q. Nguyen
(74) *Attorney, Agent, or Firm*—Oblon, Spivak, McClelland, Maier & Neustadt, P.C.

(57) ABSTRACT

A semiconductor storage device according to one embodiment of the present invention, comprising: FBCs (Floating Body Cells) which store data by accumulating a majority carrier in a floating channel body; and sense amplifiers which perform control reading out data stored in said FBC, wherein each of said sense amplifier includes: a pair of sense nodes provided corresponding to a bit line pair to which said FBC is connected; a pair of load which flow currents through said pair of sense nodes; latch circuits which latch potentials of said pair of sense nodes when a potential difference between said pair of sense nodes reaches a predetermined value; and an output control circuit which outputs latched outputs of said latch circuits at a predetermined timing and feeds back the latched outputs to said bit line pair side to again write it into said FBC.

14 Claims, 5 Drawing Sheets

SEMICONDUCTOR STORAGE DEVICE

CROSS REFERENCE TO RELATED APPLICATIONS

This application claims benefit of priority under 35USC§119 to Japanese Patent Application No. 2004-120628, filed on Apr. 15, 2004, the entire contents of which are incorporated by reference herein.

BACKGROUND OF THE INVENTION

1. Field of the Invention

The present invention relates to a semiconductor storage device including FBCs (Floating Body Cells), each of which stores data by storing majority carriers in a channel body of a FET on a semiconductor layer, which is formed on a substrate via an insulation film.

2. Background Art

As for a conventional DRAM cell including one transistor and one capacitor having a trench capacitor or a stacked capacitor, there is a concern that its fabrication becomes difficult as it becomes finer. As a memory cell that can replace the DRAM cell of this kind, a new memory cell FBC, which stores information by storing majority carriers in a floating body of a FET formed on SOI (Silicon on Insulator) or the like, was proposed (see Japanese Patent Application Laid-Open Publication Nos. 2003-68877 and 2002-246571).

Since the FBC is a non-destructive read-out cell, cell data is not destroyed even if a word line is activated. Therefore, it is not necessary to dispose, for each bit line, a sense amplifier for sensing and amplifying data and writing the data back into a cell, but it suffices to dispose one sense amplifier for a plurality of bit lines. As a result, it can make the cell efficiency higher than the conventional DRAM.

However, "a scheme in which the number of sense amplifiers is less than the number of bit lines" means that the number of cells that can be refreshed simultaneously at the time of refresh is small. Therefore, the semiconductor storage device having the conventional sense amplifier for the same refresh cycle has a problem that the refresh busy rate is lowered as compared with the conventional DRAM. In other words, even if the retention time of the FBC cell can be made equal to the retention time of the conventional DRAM cell, memory refresh operation must be conducted in the FBC more frequently than in the conventional DRAM. This results in a problem that the ratio of time during which the read/write operation of the FBC can be arbitrarily conducted decreases as compared with the conventional DRAM.

SUMMARY OF THE INVENTION

An object of the present invention is to provide a semiconductor storage device that does not lower the performance of the read/write operation for the FBC.

A semiconductor storage device according to one embodiment of the present invention, comprising: FBCs (Floating Body Cells) which store data by accumulating a majority carrier in a floating channel body; and sense amplifiers which perform control reading out data stored in said FBC, wherein each of said sense amplifier includes: a pair of sense nodes provided corresponding to a bit line pair to which said FBC is connected; a pair of load which flow currents through said pair of sense nodes; latch circuits which latch potentials of said pair of sense nodes when a potential difference between said pair of sense nodes reaches a predetermined value; and an output control circuit which outputs latched outputs of said latch circuits at a predetermined timing and feeds back the latched outputs to said bit line pair side to again write it into said FBC.

DETAILED DESCRIPTION OF THE INVENTION

Hereafter, embodiments of the present invention will be described with reference to the drawings. Embodiments described hereafter uses a sense amplifier of not a current sense scheme but a voltage sense scheme, i.e. a dynamic latch scheme. Considering from the operation of the FBC, rising of a word line alone does not naturally cause a potential difference across a bit line pair. Because of this, a current load circuit is started up to form a signal difference between the bit line pair, and the dynamic latch is activated when a desirable potential difference occurred across the bit line pair.

FIRST EMBODIMENT

Figure 1:
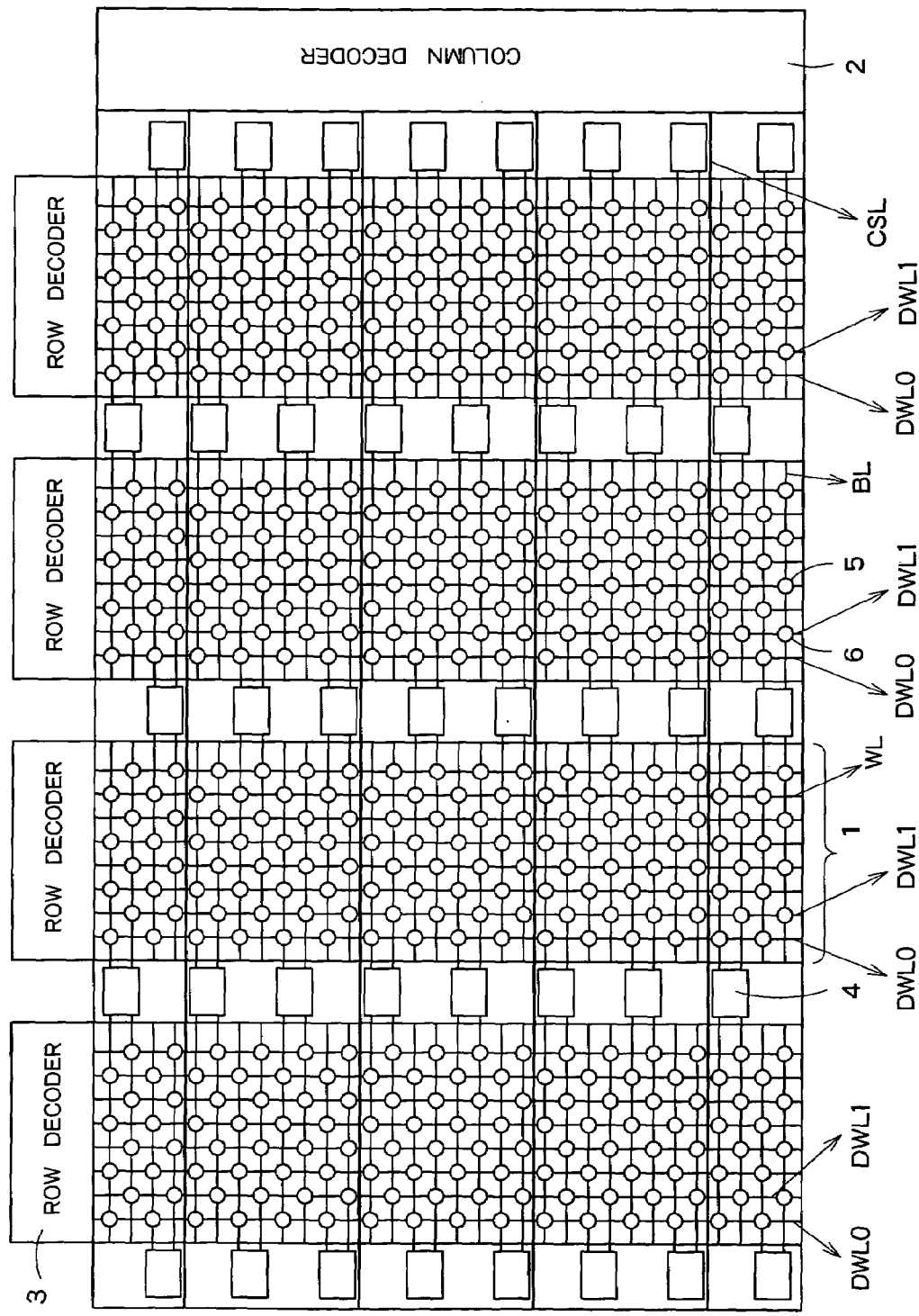
FIG. 1 is an array configuration of a semiconductor storage device according to a first embodiment of the present invention.

FIG. 1 is an array configuration of a semiconductor storage device according to a first embodiment of the present invention. The semiconductor apparatus shown in FIG. 1 includes a plurality of cell arrays 1, a column decoder 2 provided corresponding to the cell arrays, row decoders 3 provided for respective cell arrays 1, and double-end type sense amplifiers 4 provided between cell arrays 1 and on both sides of cell arrays 1.

Each cell array 1 includes a plurality of bit lines BL arranged in the column direction, a plurality of word lines WL arranged in the row direction, two dummy word lines DWL0 and DWL1, FBCs 5 each disposed near at the intersection of a bit line BL and a word line WL, and dummy cells 6 disposed near at the intersection of a bit line and a dummy word line.

The dummy cells 6 are the same as the FBCs 5 in size, shape and electric characteristics. Data "0" and data "1" are alternately written into the dummy cells 6 for respective columns.

In each cell array 1, a scheme of folded bit lines (hereafter referred to as Folded BL scheme) is adopted, and bit line pairs are connected alternately to left and right sense amplifiers 4. Each of the sense amplifiers 4 is shared by left and right (in the row direction) adjacent cell arrays 1.

First, the principle of FBC writing and reading will now be described by taking an N-MISFET as an example. A state in which there are a larger number of holes in the channel body is defined as "1". A state in which there are a smaller number of holes is defined as "0". Each FBC includes an nFET formed on a SOI substrate. Its source is connected to GND (0 V) and its drain is connected to a bit line (BL). Its gate is connected to a word line (WL), and its channel body is electrically floating.

For writing "1," the nFET is operated in a saturation state. For example, the word line WL is biased to 1.5 V and the bit line BL is biased to 1.5 V. In such a state, a large number of electron-hole pairs are generated near the drain by impact ionization. Among them, electrons are absorbed into the drain terminal, but holes are stored in the channel body having a low potential.

In a state in which a current generating holes by impact ionization balances with a forward current flowing through a p-n junction between the channel body and the source, the channel body voltage arrives at a balance state. The channel body voltage is approximately 0.7 V.

On the other hand, for writing data "0," the bit line BL is lowered to a negative voltage, such as −1.5 V. By this operation, the channel body formed of a p-region and an n-region connected to the bit line BL are biased largely in the forward direction, and many of holes stored in the channel body are emitted into the n-region. The state in which the number of holes in the channel body has thus decreased is "0".

As for the data readout, for example, the word line WL is set to 1.5 V and the bit line is set to 0.2 V, and the nFET is operated in the linear region. A current difference is sensed by using an effect (body effect) that the threshold voltage Vth of the nFET differs according to a difference in the number of holes stored in the channel body. Thereby, "1" and "0" are discriminated.

By the way, the reason why the bit line voltage is set to a low value (for example, 0.2 V) at the time of data readout will now be described. If the bit line voltage is raised to cause bias to the saturation state, then there is a fear that data will be falsely recognized as "1" by impact ionization when reading out "0" and consequently "0" cannot be correctly sensed.

In order to accurately discriminate "1" and "0" when reading out data, it is typical to provide a reference cell (dummy cell) having the same structure as that of the FBC, sense a current difference between a cell current flowing through the FBC and a cell current flowing through the reference cell, and discriminate "1" and "0" in the data.

Figure 2:
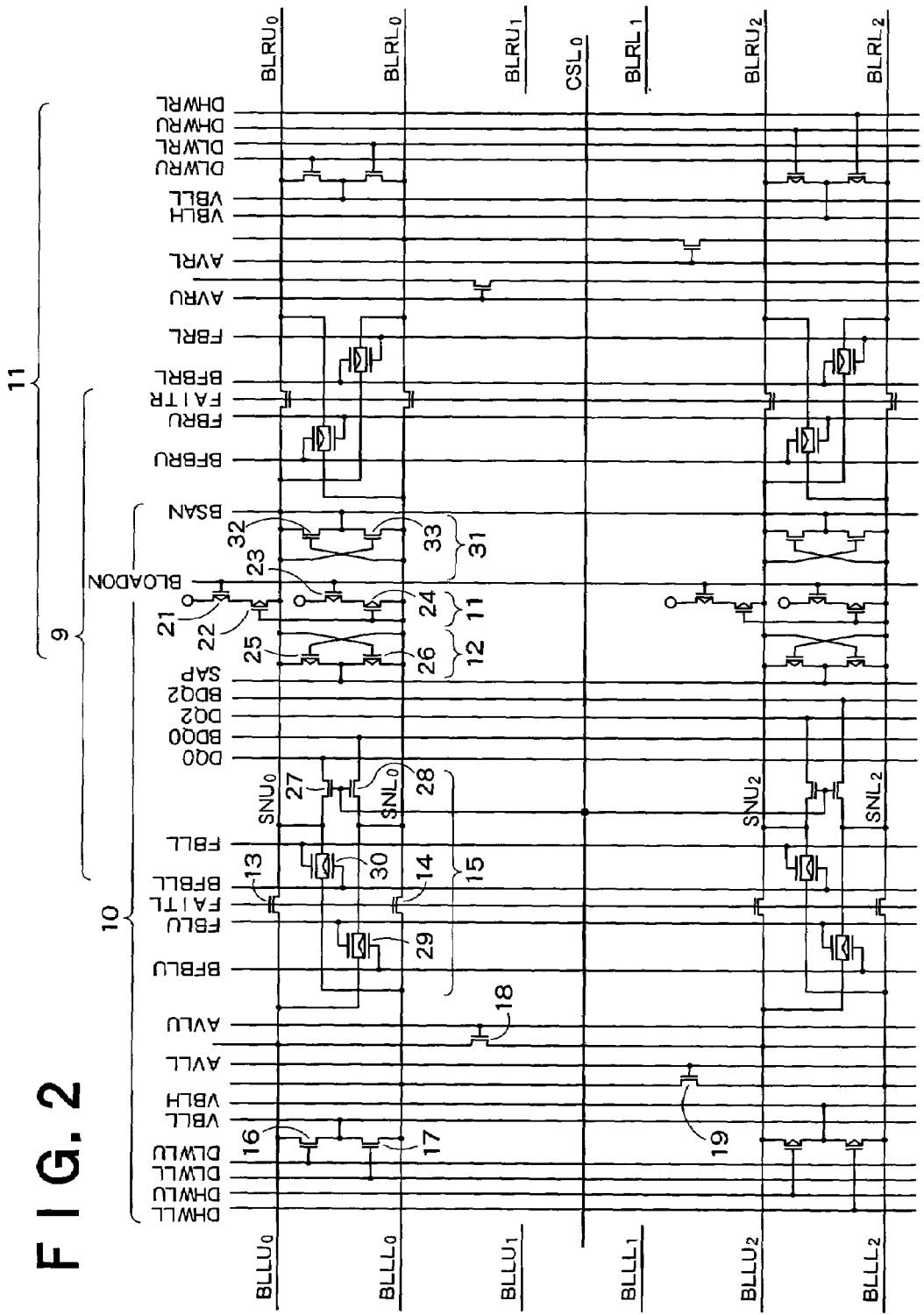
FIG. 2 is a circuit diagram showing an example of an internal configuration of a sense amplifier 4.

FIG. 2 is a circuit diagram showing an example of an internal configuration of a sense amplifier 4. The sense amplifier 4 shown in FIG. 2 is connected to two left and right adjacent cell arrays 1, and has two amplifiers 10 and 11 which sense the left and right cell arrays 1. Portions of the amplifiers 10 and 11, that is, an amplifier section 9 located inside with respect to nFETs in which FAITL and FAITR are inputted to their gates is shared by the left and right arrays. An amplifier section 10 operates when the left array is activated. Hereafter, a circuit configuration and operation of the amplifier section 10 connected to one pair of bit lines BLLU0 and BLLL0 shown on the left side of FIG. 2 will be described.

The amplifier section 10 includes one pair of sense nodes SNU0 and SNL0 corresponding to the pair of bit lines, a load circuit 11 connected to the pair of sense nodes SNU0 and SNL0, dynamic latch circuits 12 and 31 connected to the pair of sense nodes SNU0 and SNL0, control transistors 13 and 14 for controlling whether to short-circuit the pair of bit lines BLLU0 and BLLL0 respectively to the pair of sense nodes SNU0 and SNL0, an output control circuit 15 for controlling whether to cross-short-circuit the pair of bit lines BLLU0 and BLLL0 respectively to the pair of sense nodes SNU0 and SNL0, transistors 16 and 17 for setting the pair of bit lines BLLU0 and BLLL0 to a predetermined potential, and transistors 18 and 19 for short-circuiting bit lines BLLU0 and BLLU2 and bit lines BILL0 and BLLL2, respectively.

The load circuit 11 forms a current mirror circuit by providing transistors 21–24. When a signal BLOADON becomes low, the load circuit 11 allows the pair of sense nodes SNU0 and SNL0 to flow through equal currents. The dynamic latch circuits 12 and 31 include cross-connected PMOS transistors 25 and 26 and cross-connected NMOS transistors 32 and 33, respectively. If a signal SAP connected between the transistors 25 and 26 becomes high and a signal BSAN connected between the transistors 32 and 33 becomes low, then a potential difference between the pair of sense nodes SNU0 and SNL0 is amplified.

The output control circuit 15 includes a transistor 27 for switching whether to short-circuit the sense node SNU0 to a data line DQ0 according to a signal CSL0, a transistor 28 for switching whether to short-circuit the sense node SNL0 to a data line BDQ0 according to the signal CSL0, a transfer gate 29 for switching whether to short-circuit the line BLLU0 to the sense node SNL0 according to signal lines FBLU and BFBLU, and a transfer gate 30 for switching whether to short-circuit the line BLLL0 to the sense node SNU0 according to signal lines FBLL and BFBLL.

A dummy cell 6 may be connected to either of the pair of bit lines BLLU0 and BLLL0 in this embodiment. Hereafter, an example in which ordinary FBCs 5 are selected by the bit lines BLLU0 and BLLU2 and dummy cells 6 are selected by the bit lines BLLL0 and BLLL2 will be described. It is supposed that "1" is already written into a selected FBC 5 connected to the bit line BLLU0 and "0" is already written into a selected FBC 5 connected to the bit line BLLU2.

Figure 3:
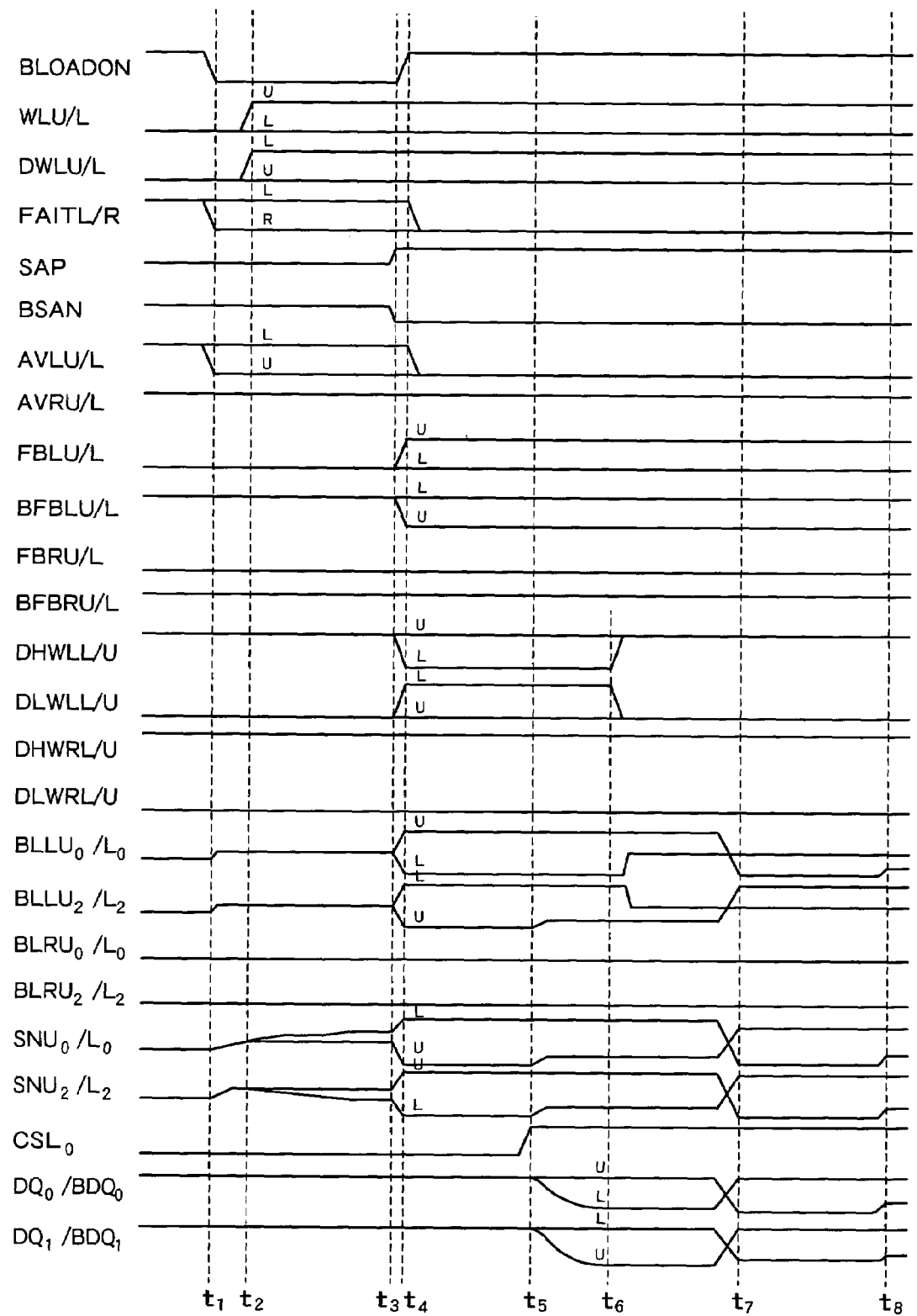
FIG. 3 is an example of an operation timing diagram of the sense amplifier 4.

FIG. 3 is an example of an operation timing diagram of the sense amplifier 4. Hereafter, operation of the sense amplifier 4 shown in FIG. 2 will be described with reference to this operation timing diagram. First, if a signal BLOADON becomes a low level at time t1, then the transistors 21 and 23 turn on and a load current flows through the pair of sense nodes SNU0 and SNL0. Thereafter, a word line and a dummy word line belonging to the left side array rise at time t2, and a potential difference occurs between the sense nodes SNU0 and SNL0. Specifically, if "1" is connected to an FBC 5 connected to the bit line BLLU0, then the threshold of the FBC 5 is low, and consequently the potential at the sense node SNL0 gradually becomes higher than potential at the sense node SNU0 corresponding to the bit line BLLU0 (between t2 and t3 shown in FIG. 3. As for movement of the potential, see the next paragraph). If "0" is connected to an FBC 5 connected to the bit line BLLU2, then the threshold of the FBC 5 is high, and consequently the potential at the sense node SNU2 corresponding to the bit line BLLU2 becomes higher than potential at the other sense node SNL2 (between t2 and t3. As for movement of the potential, see the next paragraph).

At time t2, a signal AVLL is high, and consequently the bit lines BLLL0 and BLLL2 connected to the dummy cells 6 are short-circuited to each other. Since one of the dummy cells 6 has "0" written therein and the other of the dummy cells 6 has "1" written therein, potentials on the bit lines BLLL0 and BLLU2 become an intermediate potential. Since thus mutually different data are written into adjacent dummy cells and short-circuit is conducted to generate an intermediate potential, it becomes unnecessary to generate the intermediate potential inside or supply the intermediate potential from the outside.

If the signal SAP becomes high and the signal BSAN becomes low at the time t3 when the potential difference between the sense nodes SNU0 and SNL0 has become sufficiently large, then the dynamic latch circuits 12 and 31 conduct latch operation, and the potential difference between the sense nodes SNU0 and SNL0 is amplified to an amplitude between VBLH (for example, 2 V) and VBLL (for example, −1.5 V). At this time, the signal FAITL becomes a low level, and the transistors 13 and 14 turn off. As a result, the bit line BLLU0 and the sense node SNU0 are cut off, and the bit line BLLL0 and the sense node SNL0 are also cut off.

At the same time, the signal FBLU becomes high and the signal BFBLU becomes low, and consequently the sense node SNL0 is short-circuited to the bit line BLLU0. As a result, "1" is rewritten into the selected FBC 5 connected to the bit line BLLU0, and refreshing is conducted. In this way, the refreshing feeds back a sense node to a bit line of opposite side.

Furthermore, at the time t3, a signal DLWLL becomes high and the transistor 16 turns on, and consequently the voltage VBLL is supplied to the bit line BLLL0 and "0" is written into a dummy cell connected to the bit line BLLL0. At the same time, a signal DHWLL becomes low, and "1" is written into a dummy cell 6 connected to the adjacent bit line BLLL2. As a result, "0" and "1" are alternately written into the dummy cells 6 which are adjacent in the column direction.

The bit line connected to these dummy cells 6 are short-circuited, as described above, when the signal AVLL has become high, and it is effectively equivalent to a state in which the dummy cells 6 having an intermediate potential of "½" are connected. In addition, a large number of bit line pairs of "0" and "1" are short-circuited, and consequently dispersion in electric characteristics among the dummy cells 6 can be averaged. As a result, dispersion in the threshold voltage Vth among the dummy cells 6 in the chip can be suppressed, and the yield of chips can be improved as compared with the case where pairs of the dummy cells 6 exist respectively singly.

If thereafter the signal CSLO becomes high at time t5, then the transistors 27 and 28 in the output control circuit 15 turn on, and potentials at the sense nodes SNU0 and SNL0 are output to DQ0 and BDQ0, respectively. For example, if the selected FBC 5 connected to the bit line BLLU0 has "1" written therein, the DQ0 becomes low and the BDQ0 becomes high. If the selected FBC 5 connected to the bit line BLLU2 has "0" written therein, the DQ2 becomes high and the BDQ2 becomes low.

Thereafter, at time t6 the signal DLWLL becomes low, and the potential on the bit line BLLL0 rises to 0 V. In the same way, the signal DHWLL becomes high, and the potential on the bit line BLLL2 falls to 0 V. As a result, writing into the selected dummy cell 6 is finished.

Thereafter, logic levels of the signals DQ0 and BDQ0 change at time t7. As a result, the dynamic latch circuit 12 reverses its latched state, and data is written into the selected FBCs 5 via the bit lines BLLU0 and BLLU2 of the cell side.

Thus, in the first embodiment, a sense amplifier 4 is provided for one pair of bit lines BLLU0 and BLLL0. In the sense amplifier 4, a minute potential difference between the pair of sense nodes SNU0 and SNL0 respectively corresponding to the pair of bit lines BLLU0 and BLLL0 is amplified and output by the dynamic latch circuits 12 and 31. This output is fed back to refresh the FBC 5. Therefore, the refresh efficiency is improved, and the ratio of read/write operation limited by the refresh operation is lowered.

SECOND EMBODIMENT

In a second embodiment, sense operation is conducted without using the dummy cells 6.

Figure 4:
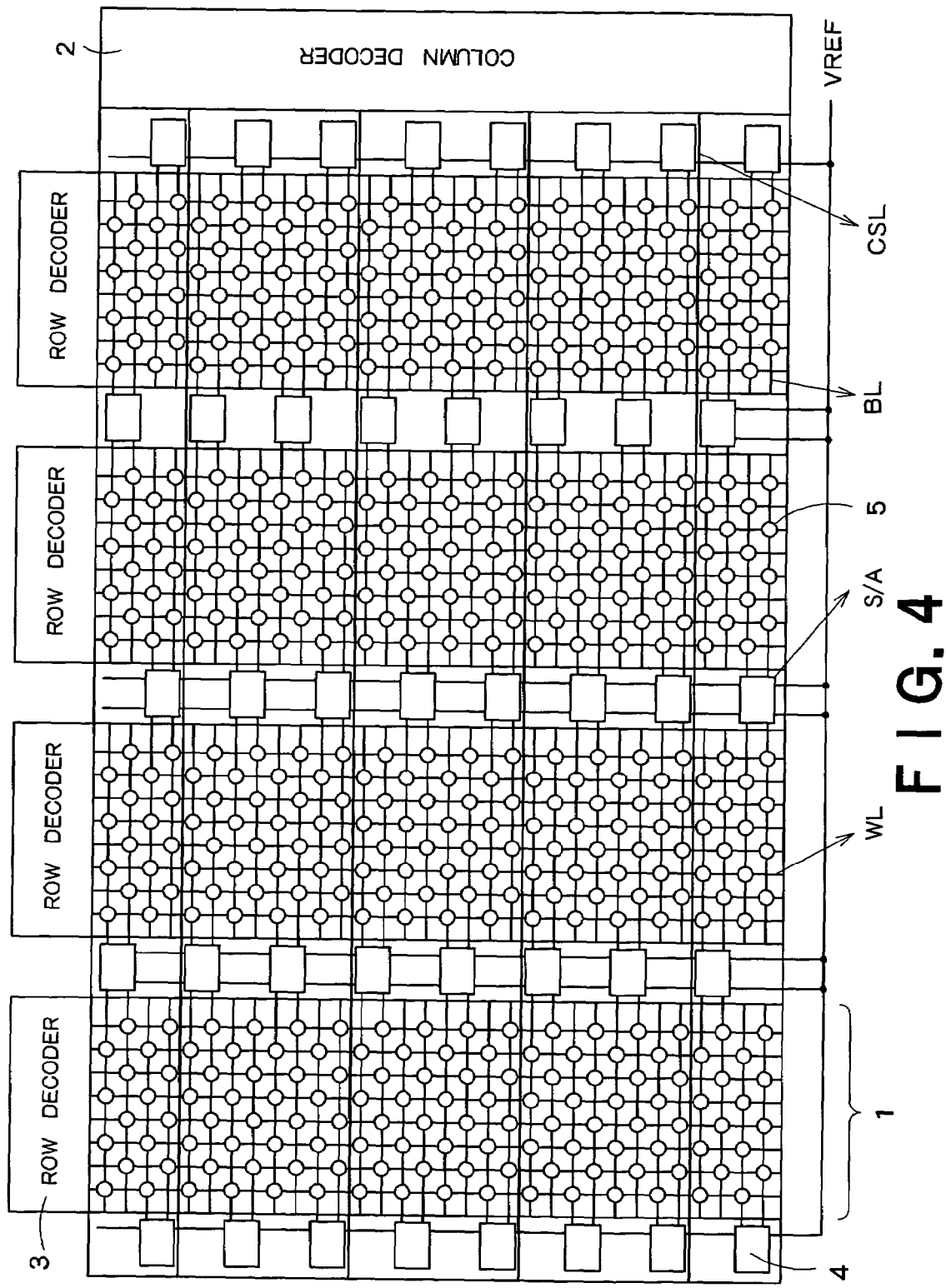
FIG. 4 is an array configuration diagram of an FBC 5 memory according to the second embodiment of the present invention.

FIG. 4 is an array configuration diagram of an FBC 5 memory according to the second embodiment of the present invention. In the FBC 5 memory shown in FIG. 4, only FBCs 5 are provided, and dummy cells 6 do not exist. A reference voltage VREF is input to all sense amplifiers 4 from the outside of the array.

Figure 5:
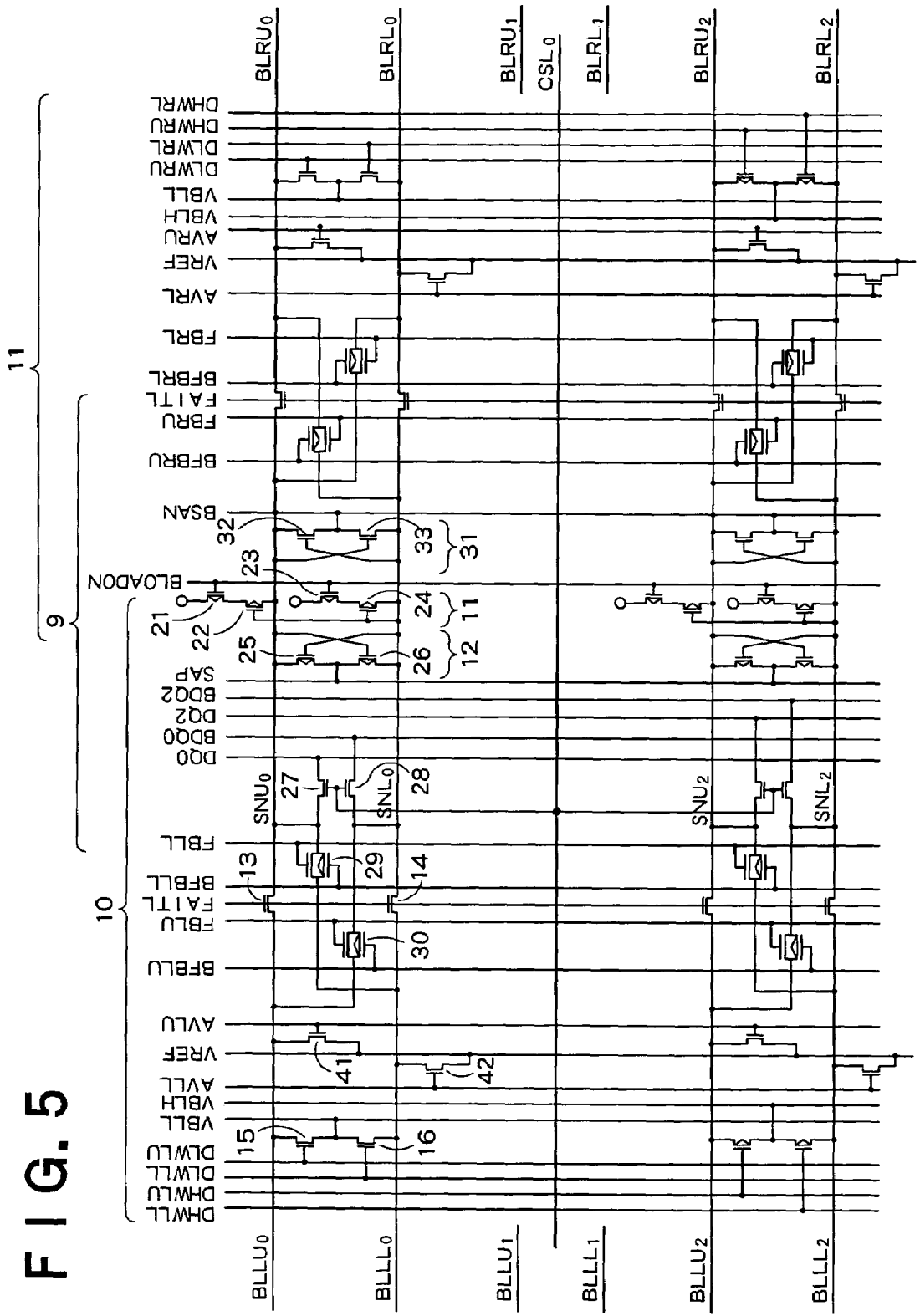
FIG. 5 is a circuit diagram showing an example of an internal configuration of the sense amplifier 4 in the second embodiment.

FIG. 5 is a circuit diagram showing an example of an internal configuration of the sense amplifier 4 in the second embodiment. In FIG. 5, components common to those shown in FIG. 2 are denoted by like characters, and hereafter mainly different points will be described.

The sense amplifier 4 shown in FIG. 5 has transistors 41 and 42 for setting each bit line to a reference potential VREF. Instead, the transistors for short-circuiting bit lines shown in FIG. 2 do not exist.

The reference potential VREF is an intermediate potential between VBLL and VBLH. It is necessary to generate such a reference potential VREF within the chip or to input it from the outside of the chip.

Operation timing of the FBC 5 memory according to the second embodiment is similar to that shown in FIG. 3. At the time when the bit lines BLLL0 and BLLL2 are short-circuited to each other in FIG. 2, the transistors 41 and 42 turn on to set these bit lines to the intermediate potential VREF.

Thus, in the second embodiment, operation and effects similar to those of the first embodiment can be obtained by using a circuit configuration simplified as compared with the first embodiment.

It is worth noting that in this second embodiment, supplying the reference voltage VREF to the bit lines is equivalent to drawing a current from the current load circuit 11 whose amount is equal to what is drawn by dummy cells in the first embodiment.

What is claimed is:

1. A semiconductor storage device, comprising:
   FBCs (Floating Body Cells) which store data by accumulating a majority carrier in a floating channel body; and
   sense amplifiers which perform control reading out data stored in said FBC,
   wherein each of said sense amplifier includes:
   a pair of sense nodes provided corresponding to a bit line pair to which said FBC is connected;
   a pair of load which flow currents through said pair of sense nodes;
   latch circuits which latch potentials of said pair of sense nodes when a potential difference between said pair of sense nodes reaches a predetermined value; and
   an output control circuit which outputs latched outputs of said latch circuits at a predetermined timing and feeds back the latched outputs to said bit line pair to again write it into said FBC.

2. The semiconductor storage device according to claim 1, wherein said pair of load circuits has a current mirror circuit capable of flowing the equal amount of currents from a reference voltage to said pair of sense nodes at a predetermined timing.

3. The semiconductor storage device according to claim 1, further comprising a pair of transfer gates connected between said pair of bit lines and the corresponding pair of sense nodes.

4. The semiconductor storage device according to claim 3, wherein said output control circuit short-circuits one of said pair of sense nodes to the bit line opposite to the bit line at readout time, and rewrites data into said FBC, after latch operation of said latch circuit is finished, at a state of cutting off said transfer gate.

5. The semiconductor storage device according to claim 1, further comprising reference cells provided corresponding to said bit line pair, which can be independently selected by dummy word lines and have the same size, shape and electric properties as those of said FBC, to which predetermined values are written in advance, respectively,
wherein said reference cells selected by the dummy word lines are connected to one of said bit line pair, and said FBC selected by the word lines are selected to another of said bit line pair; and
one bit line of said bit line pair, to which said reference cell is connected, and one bit line of an adjacent bit line pair, to which said reference cell are connected, are set to intermediate potentials, respectively.

6. The semiconductor storage device according to claim 5, further comprising a bit line short-circuit which short-circuits one bit line of said bit line pair, to which said reference cell is connected, and one bit line of an adjacent bit line pair, to which said reference cell are connected, at a predetermined timing,
wherein "0" is written into both of said reference cells connected to said bit line pair, and "1" is written into both of said reference cells connected to adjacent bit line pair and both of said reference cells.

7. The semiconductor storage device according to claim 6, wherein said bit line short-circuit circuit sets one bit line of said bit line pair, to which said reference cell is connected, and one bit line of an adjacent another bit line pair, to which said reference cell is connected, to intermediate potentials, before said output control circuit rewrites said FBC.

8. The semiconductor storage device according to claim 1, wherein said bit line pairs are arranged to both ends of said sense amplifier, respectively.

9. The semiconductor storage device according to claim 8, wherein said sense amplifier includes:
a first amplifier which senses said bit line pair arranged in a first direction; and
a second amplifier which senses an another bit line pair arranged in a second direction,
wherein said first and second amplifiers share said pair of load circuits, and have said latch circuit and said output control circuit separately from each other.

10. The semiconductor storage device according to claim 1, wherein a plurality of bit line pairs arranged in row direction are connected to said sense amplifiers arranged alternatively from side to side.

11. The semiconductor storage device according to claim 1, wherein said latch circuit is a dynamic latch circuit having a plurality of MOS transistors cross-connected between said pair of sense nodes.

12. The semiconductor storage device according to claim 11, wherein said dynamic latch circuit is provided corresponding to two pairs of sense nodes arranged to both ends of said sense amplifier.

13. The semiconductor storage device according to claim 1, further comprising an intermediate potential setting circuit which sets one bit line of said bit line pair and one bit line of an adjacent another bit line pair to intermediate potentials at a predetermined timing.

14. The semiconductor storage device according to claim 11, wherein said intermediate potential setting circuit sets one bit line of said bit line pair and one bit line of an adjacent another bit line pair to intermediate potentials at a predetermined timing, before said output control circuit rewrites said FBC.

* * * * *